(12) United States Patent
Takamatsu

(10) Patent No.: US 7,091,797 B2
(45) Date of Patent: Aug. 15, 2006

(54) MOS-TYPE VARIABLE CAPACITANCE ELEMENT AND VOLTAGE CONTROL OSCILLATION CIRCUIT

(75) Inventor: Masashi Takamatsu, Tokyo (JP)

(73) Assignee: Seiko NPC Corporation, Tokyo (JP)

( * ) Notice: Subject to any disclaimer, the term of this patent is extended or adjusted under 35 U.S.C. 154(b) by 2 days.

(21) Appl. No.: 10/863,445

(22) Filed: Jun. 8, 2004

(65) Prior Publication Data

US 2004/0263269 A1    Dec. 30, 2004

(30) Foreign Application Priority Data

Jun. 24, 2003    (JP)    ............................. 2003-178909

(51) Int. Cl.
*H01L 27/108*    (2006.01)
*H03B 5/00*    (2006.01)

(52) U.S. Cl. .................................. 331/177 V; 257/312

(58) Field of Classification Search ........... 331/177 V; 257/312

See application file for complete search history.

(56) References Cited

U.S. PATENT DOCUMENTS

| | | | |
|---|---|---|---|
| 6,100,770 A | | 8/2000 | Litwin et al. |
| 6,469,587 B1 * | | 10/2002 | Scoggins ................. 331/117 R |
| 6,521,939 B1 * | | 2/2003 | Yeo et al. .................... 257/312 |

FOREIGN PATENT DOCUMENTS

JP    2001-516955    10/2001

OTHER PUBLICATIONS

Pietro Andreani et al.; On the Use of MOS Varactors in RF VCO's; IEEE Journal of Solid State Circuits: vol. 35, No. 6, Jun. 2000, pp. 905-910.

* cited by examiner

*Primary Examiner*—Joseph Chang
(74) *Attorney, Agent, or Firm*—Jordan and Hamburg LLP

(57) ABSTRACT

The present invention provides a MOS-type variable capacitance element which can obtain a sufficient capacitance valuable width and, at the same time, can eliminate restrictions imposed on a control voltage range. A MOS-type variable capacitance element includes a MOS transistor in which an N well having polarity opposite to polarity of the P type is formed on a P type semiconductor substrate, a pair of source and drain regions are formed in the inside of the N well, an N-type high-concentration region is formed in the inside of the N well, a gate oxide film is formed on the N well, and a gate electrode is formed on the gate oxide film, a first electrode which connects the source and drain regions to a reference potential, a second electrode which is connected to the gate electrode, and a third electrode which is connected to the N well and applies a control voltage having polarity equal to polarity of the P type to the N well using the reference potential as a reference, wherein a variable capacitance element is provided between the second electrode and the third electrode.

13 Claims, 12 Drawing Sheets

(Fig. 1)
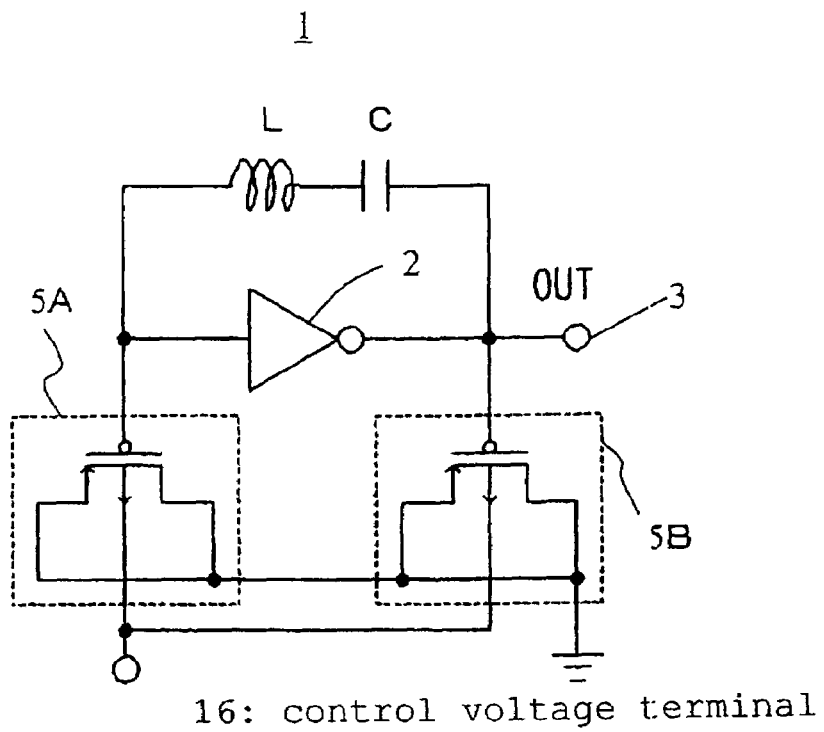
16: control voltage terminal
(Fig. 2)
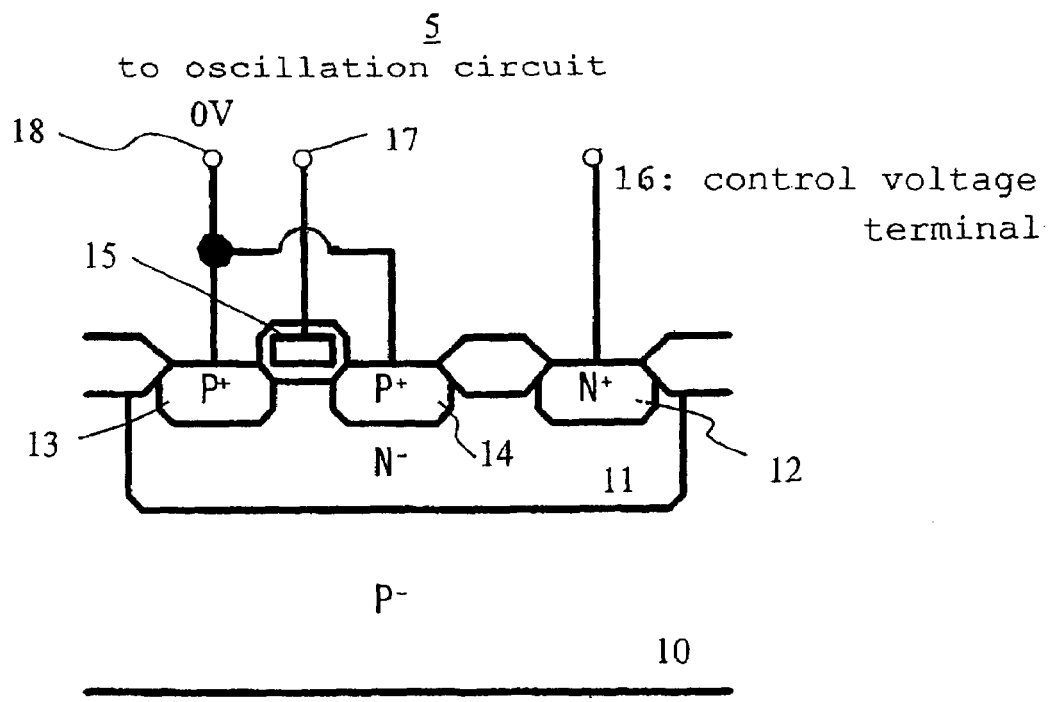

(Fig. 3)
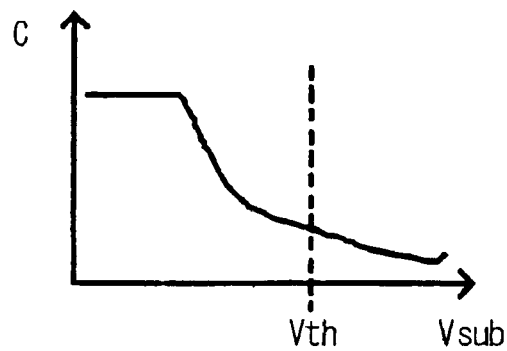
(Fig. 4)
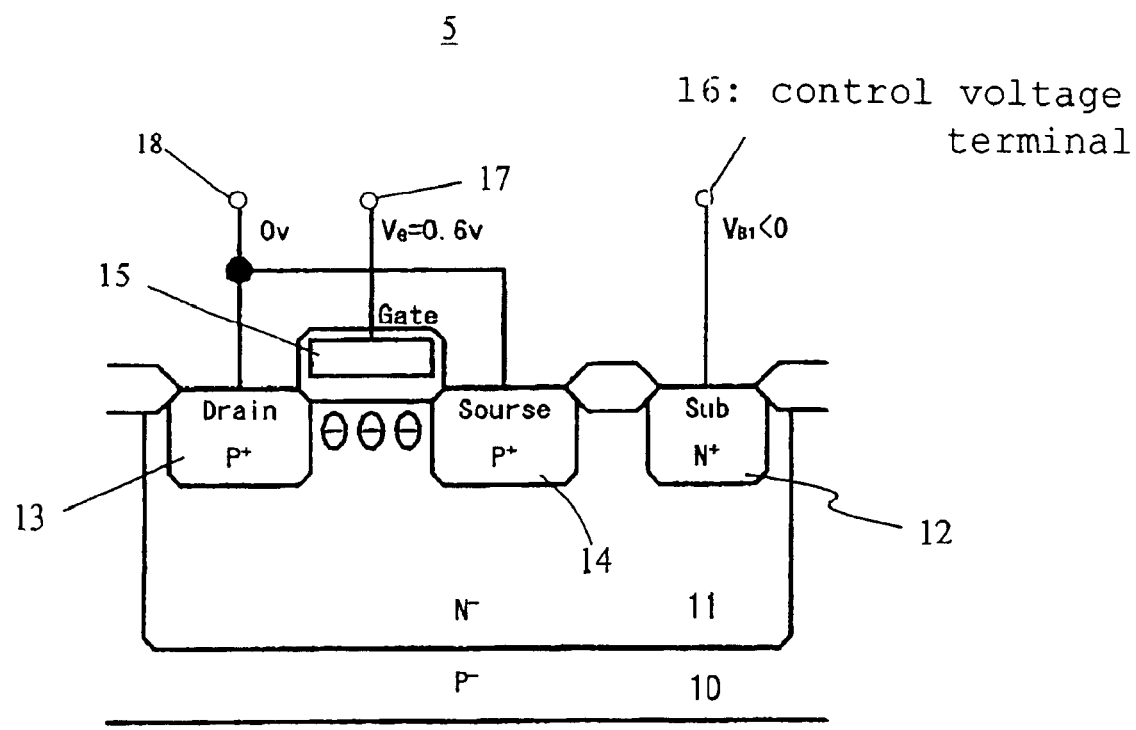

(Fig. 5)
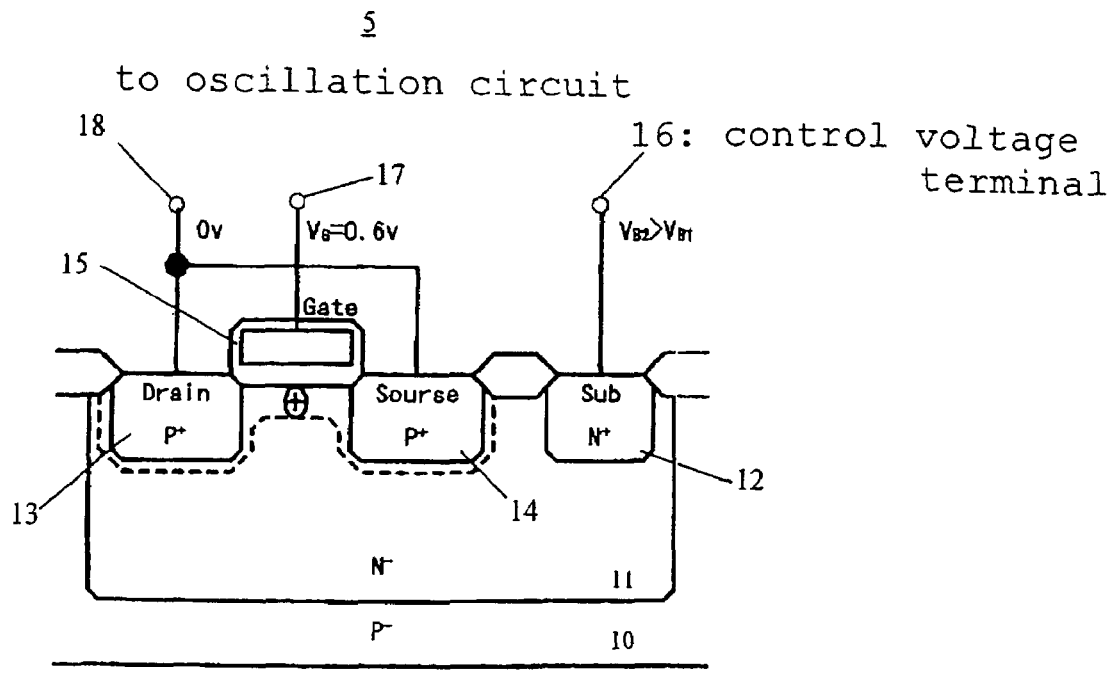
(Fig. 6)
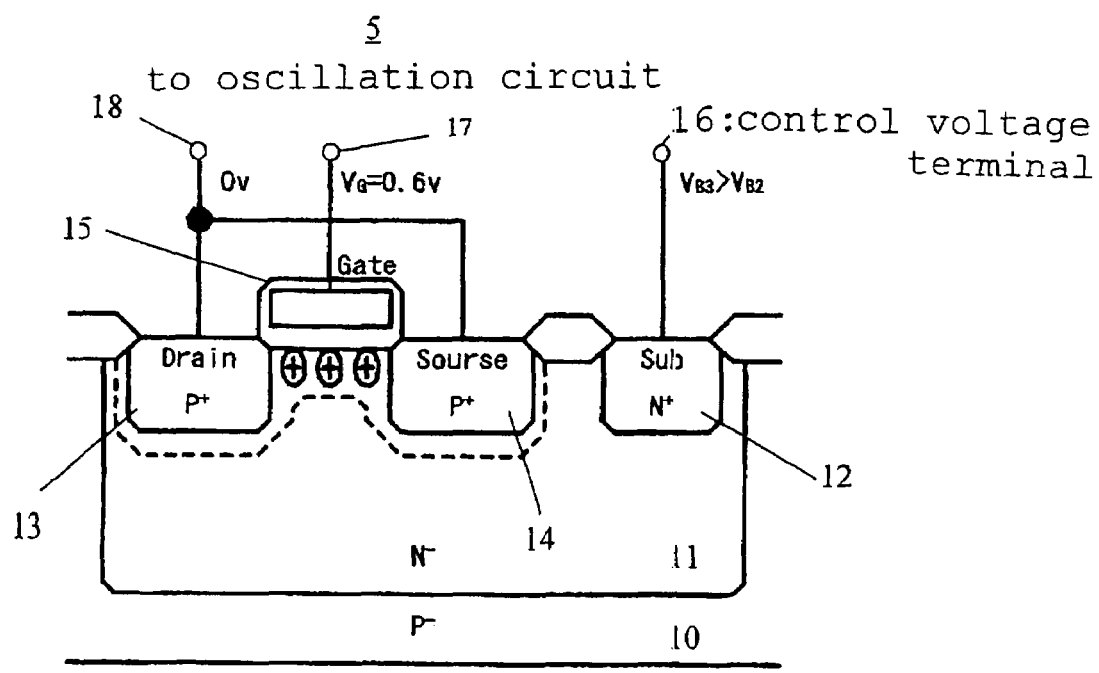

(Fig. 7)
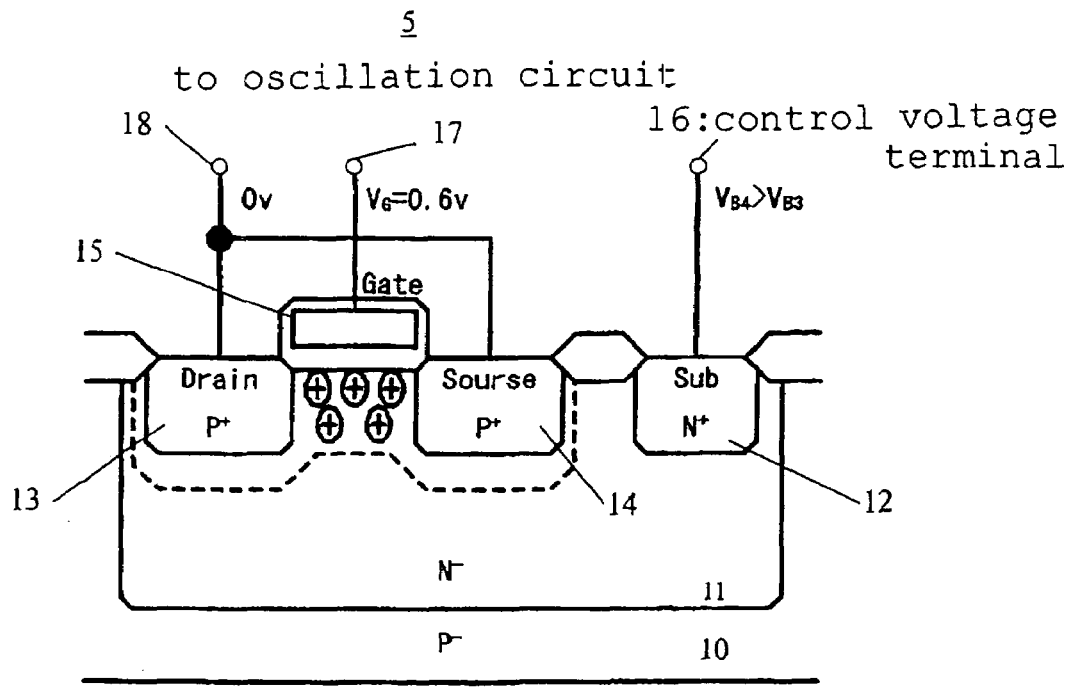
(Fig. 8)
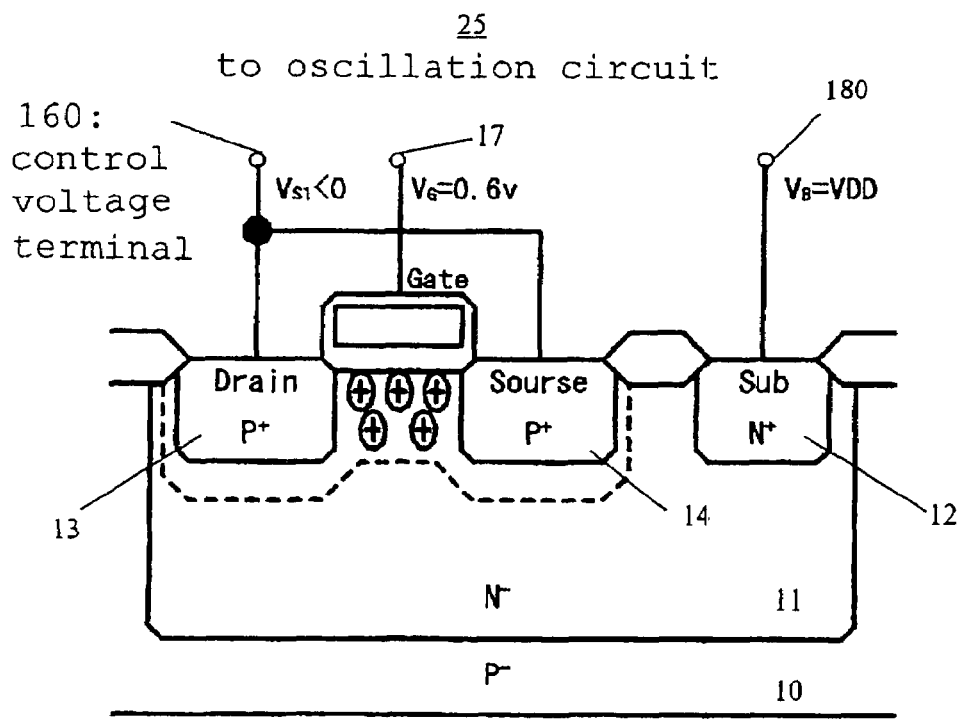

(Fig. 9)
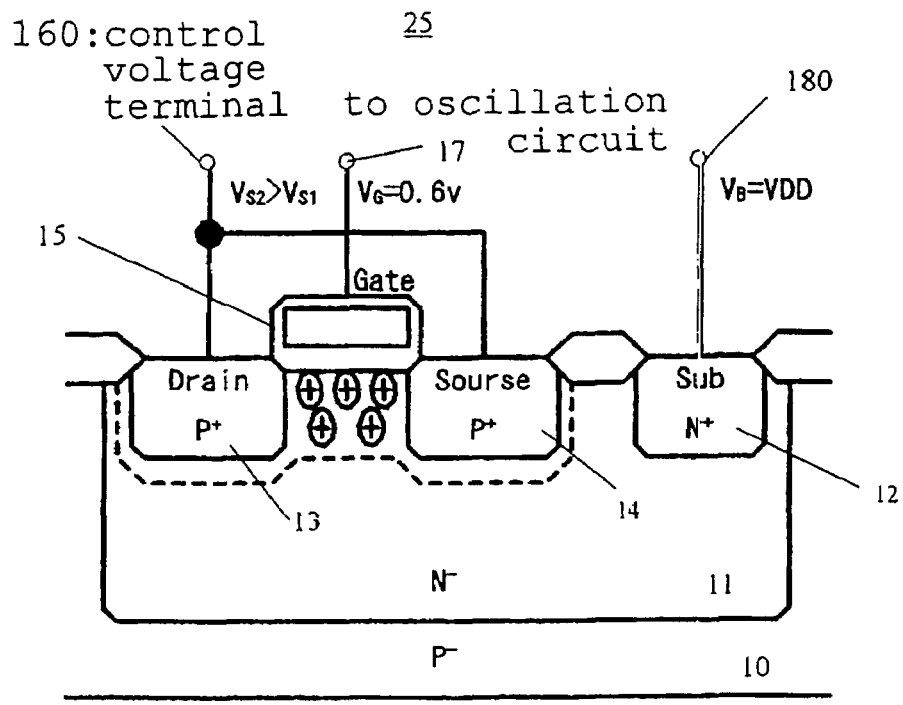
(Fig. 10)
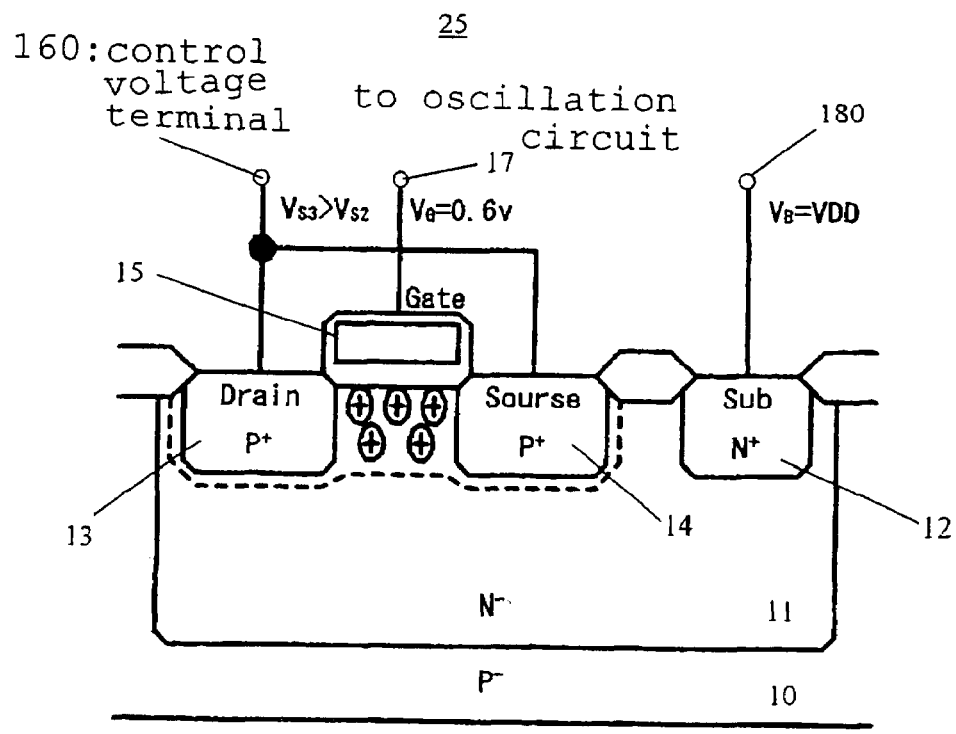

(Fig. 11)
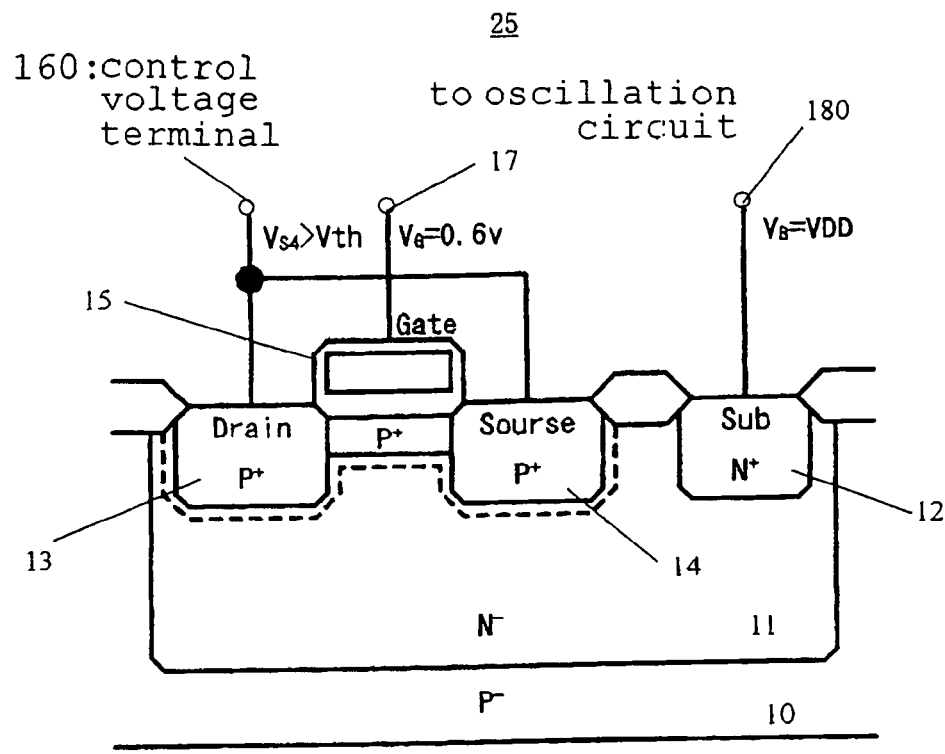
(Fig. 12)
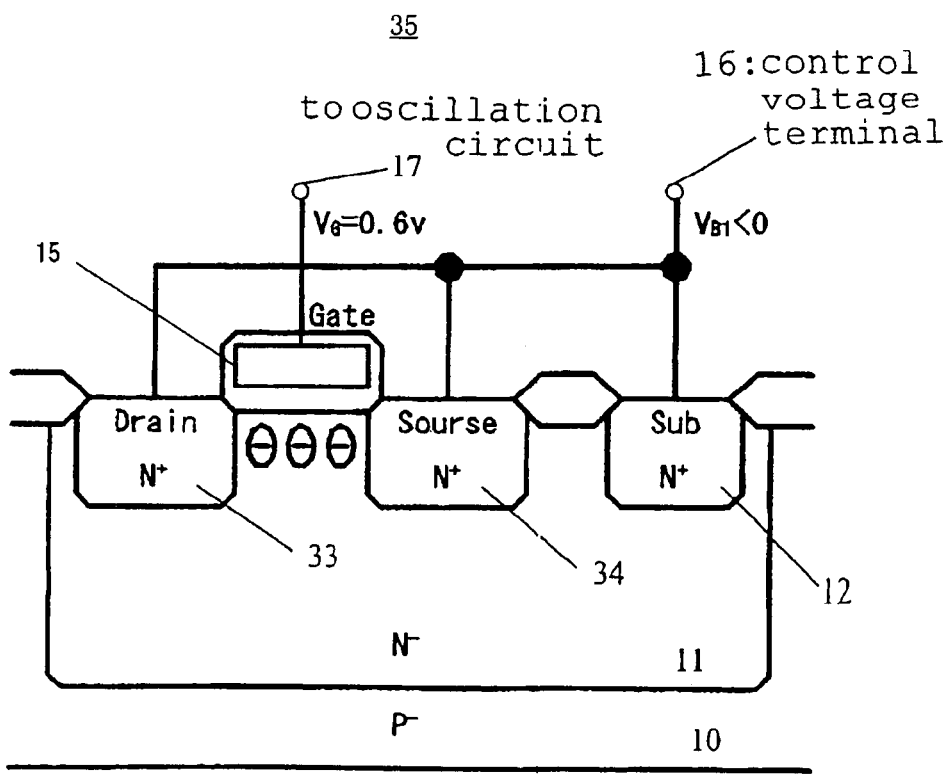

(Fig. 13)
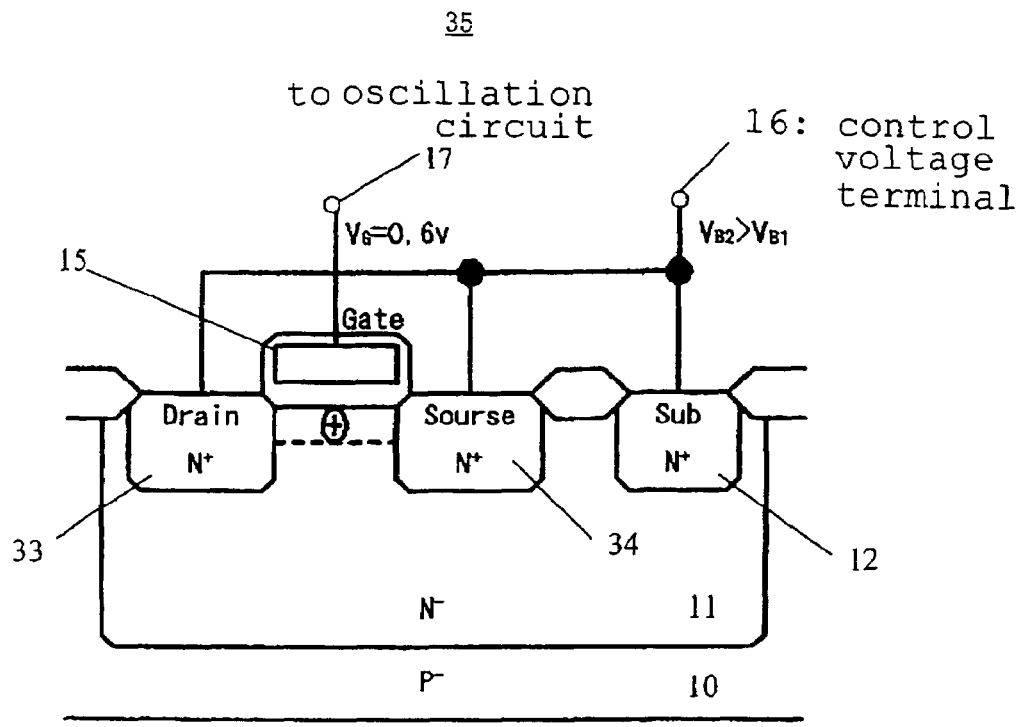
(Fig. 14)
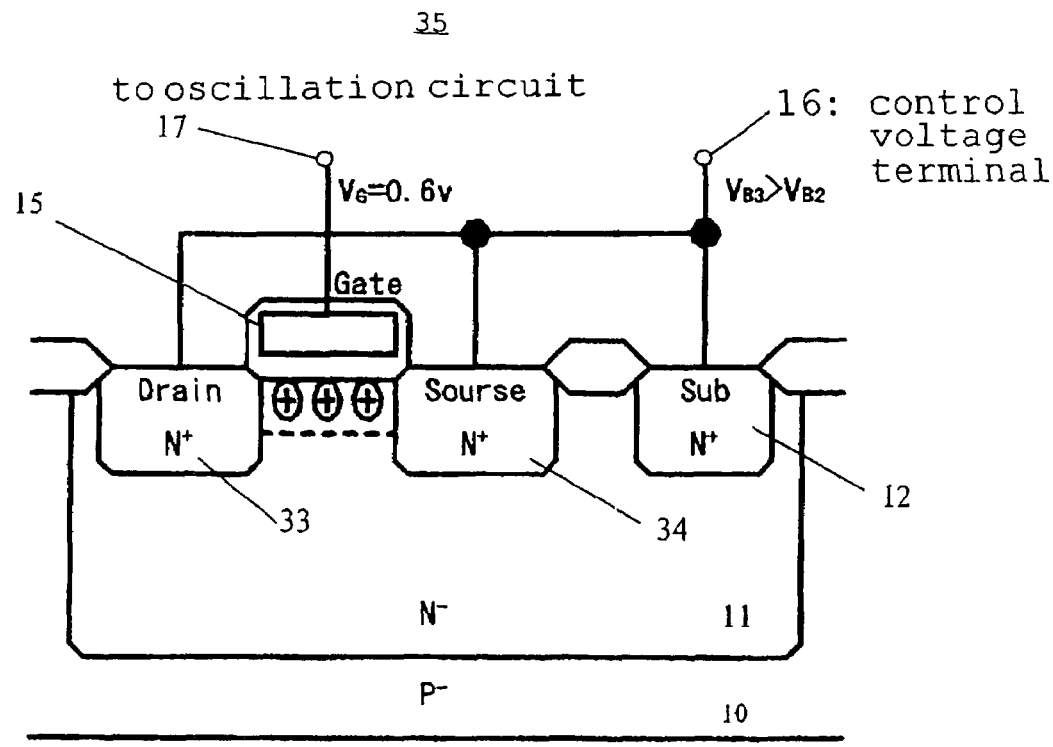

(Fig. 15)
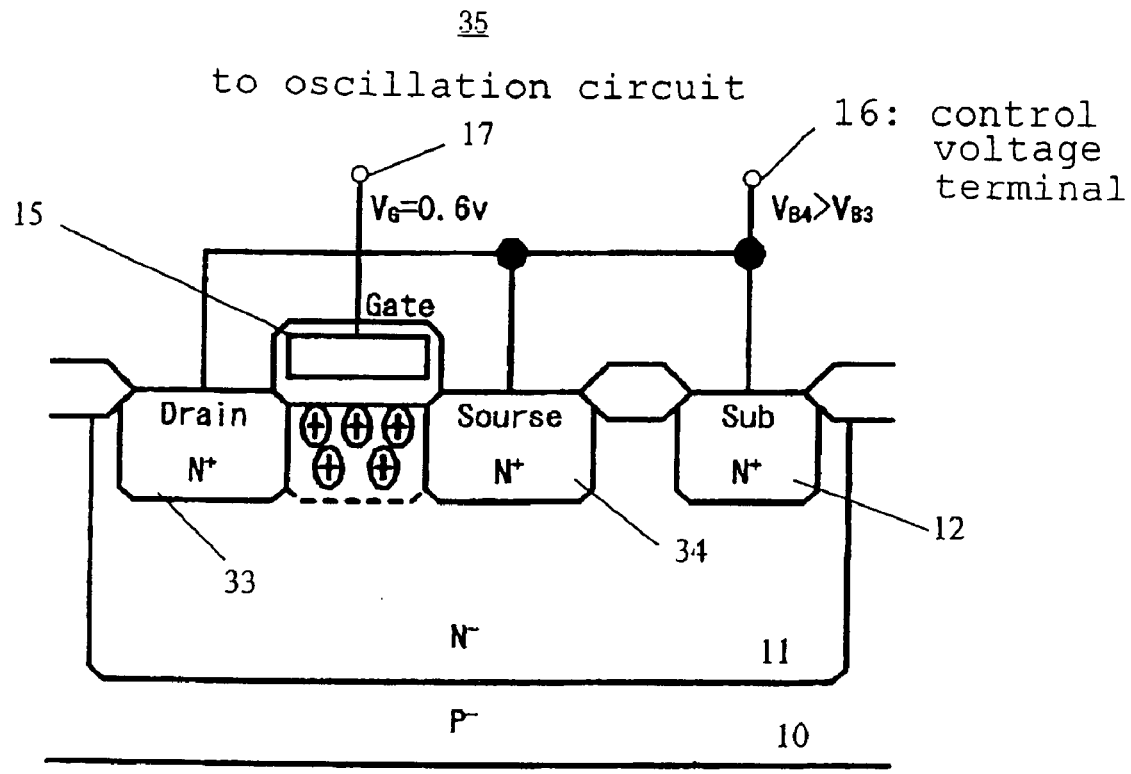
(Fig. 16)
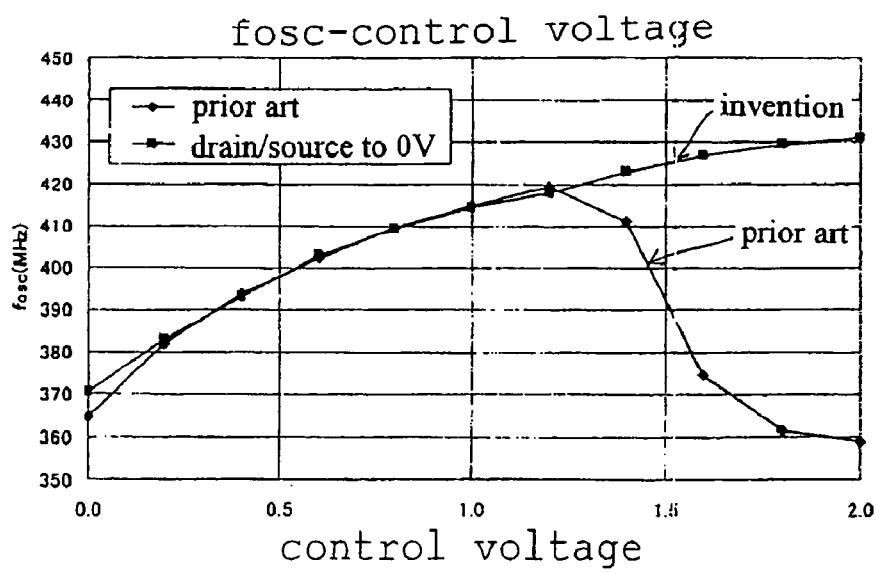

(Fig. 17)
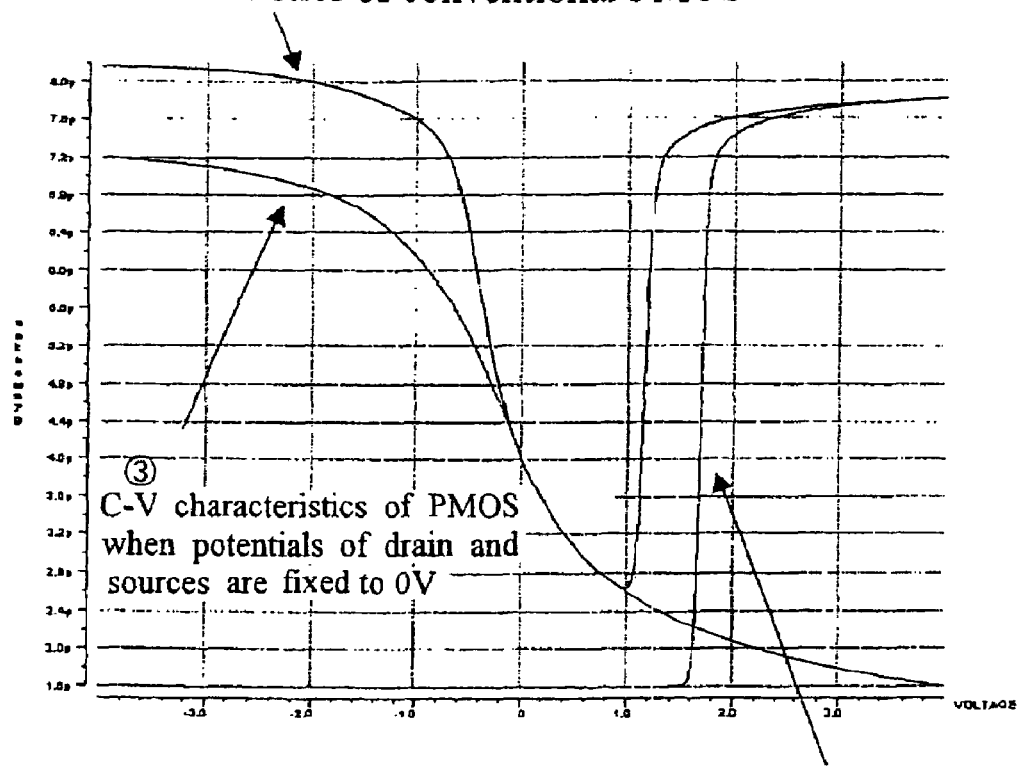
① C-V characteristics of conventional PMOS
③ C-V characteristics of PMOS when potentials of drain and sources are fixed to 0V
② C-V characteristics of PMOS when potential of SUB is fixed to VDD
(IEEE, Journal of Solid-state Circuit Vol.35 No.6 June 2000)

(Fig. 18)
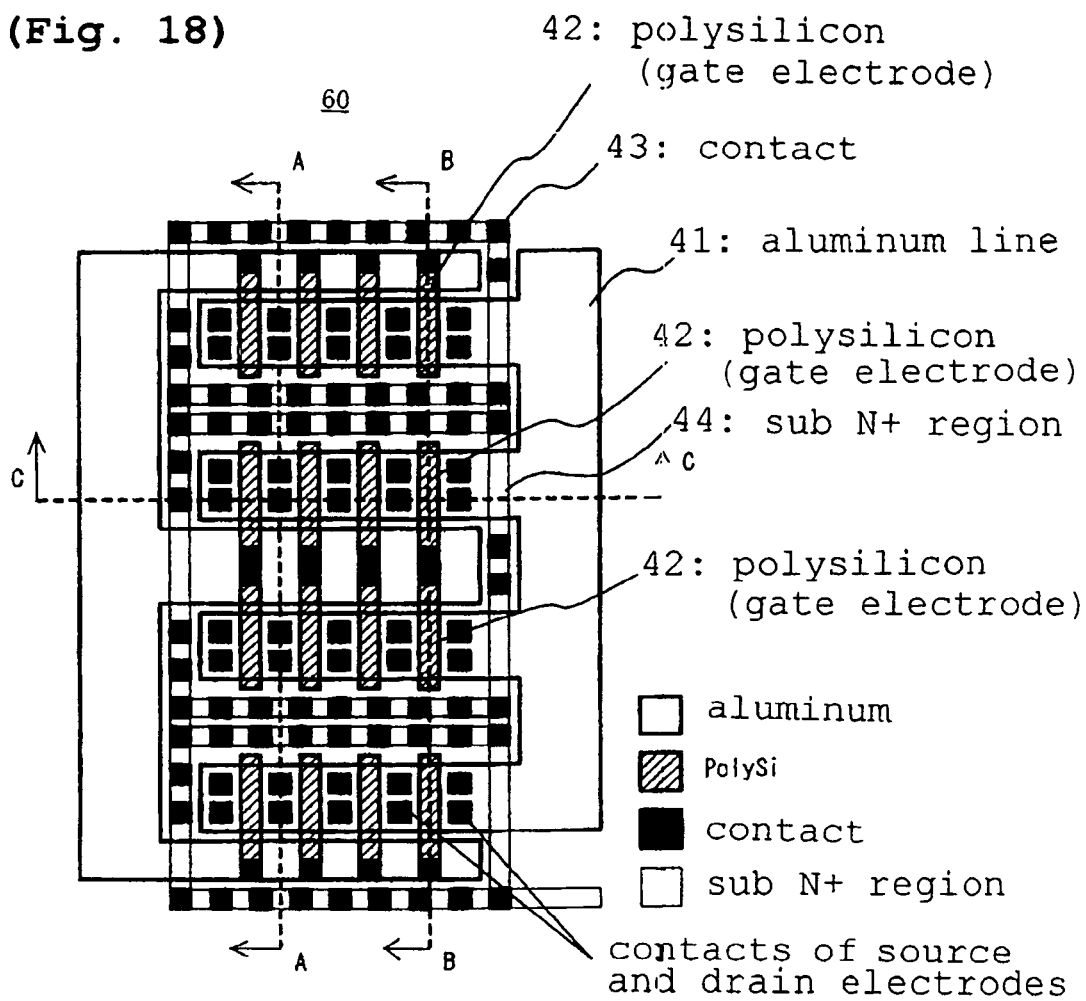
42: polysilicon (gate electrode)
43: contact
41: aluminum line
42: polysilicon (gate electrode)
44: sub N+ region
42: polysilicon (gate electrode)
☐ aluminum
▨ PolySi
■ contact
☐ sub N+ region
contacts of source and drain electrodes
(Fig. 19)
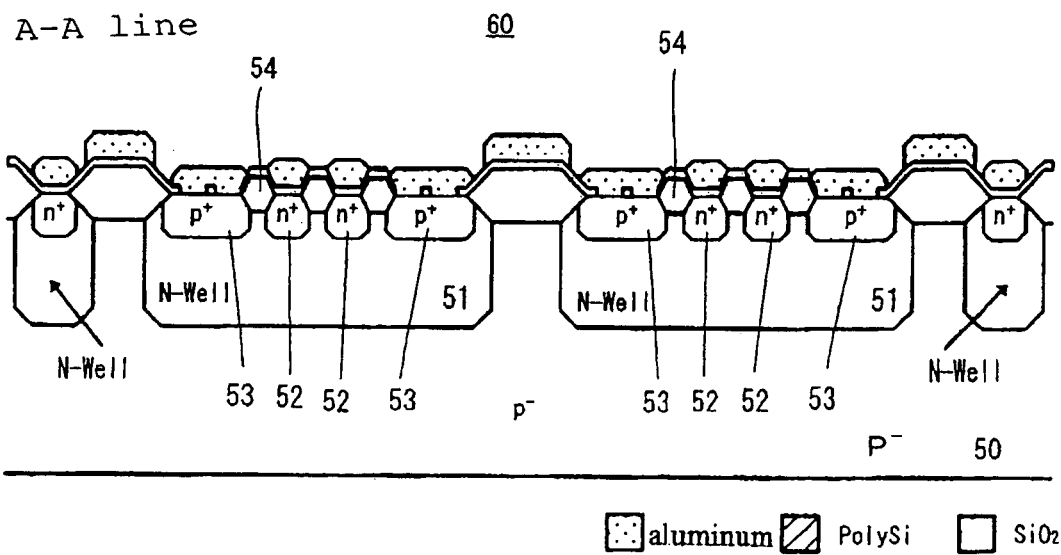
A-A line
☐ aluminum  ▨ PolySi  ☐ SiO₂

(Fig. 20)
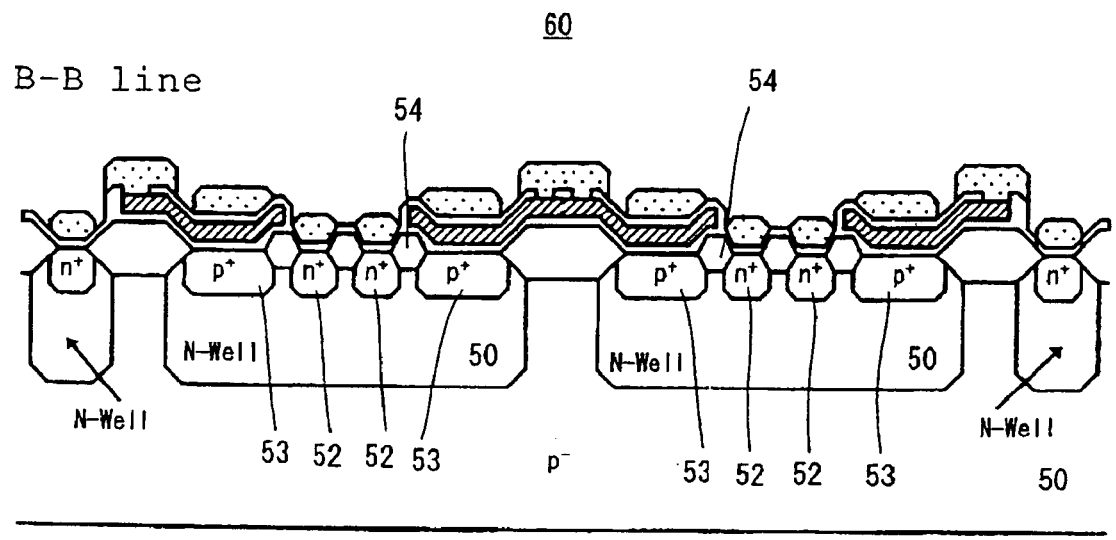
(Fig. 21)
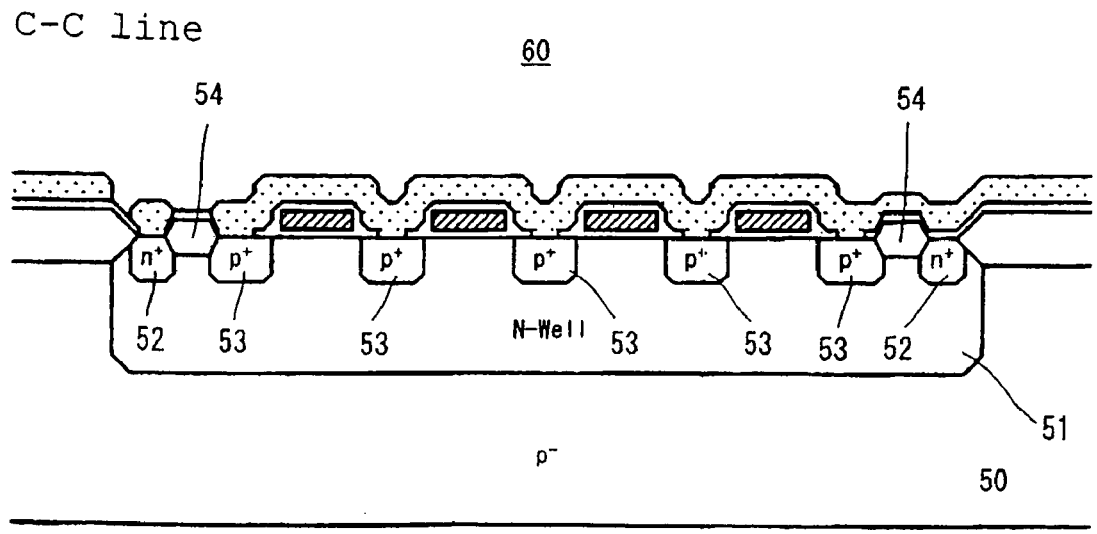

(Fig. 22)
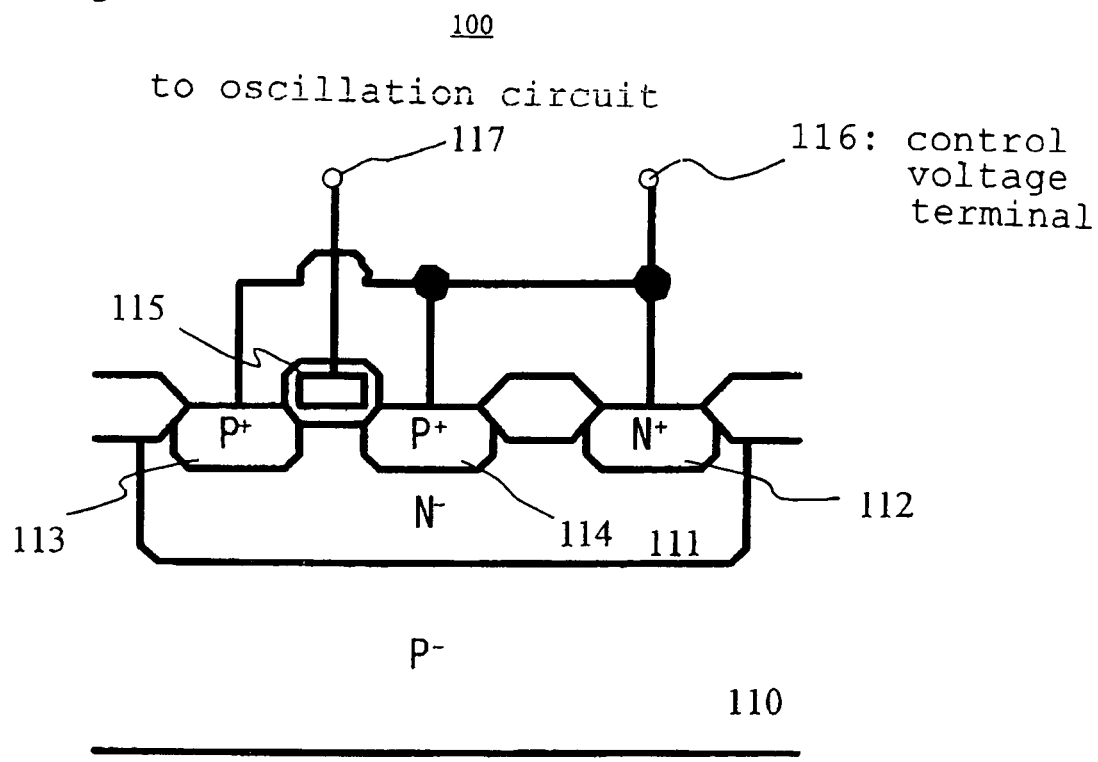
(Fig. 23)
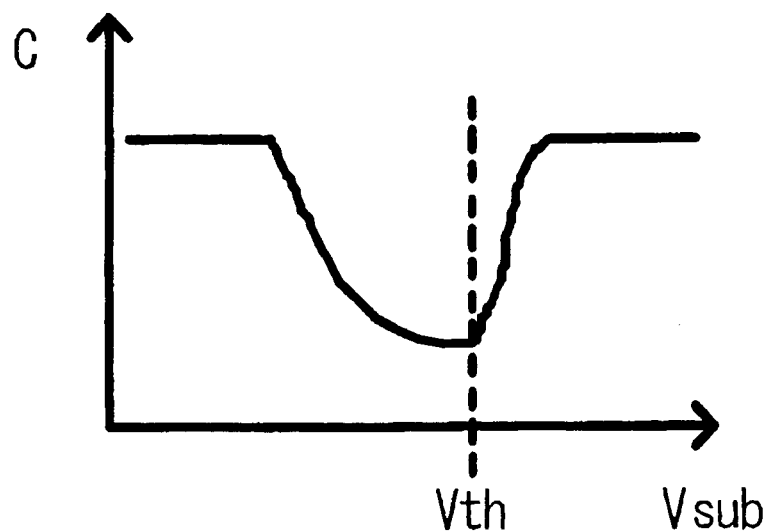
C-V characteristics of conventional PMOS

MOS-TYPE VARIABLE CAPACITANCE ELEMENT AND VOLTAGE CONTROL OSCILLATION CIRCUIT

BACKGROUND OF THE INVENTION

The present invention relates to a MOS-type variable capacitance element and a voltage control oscillation circuit.

Conventionally, there has been proposed a MOS-type variable capacitance element of a voltage controlled oscillator which is used in a RF field such as communication. FIG. 22 is a cross-sectional view of a conventional MOS-type variable capacitance element. As shown in FIG. 22, the MOS-type variable capacitance element 100 is configured such that an N well 111 is formed on a P-type Si substrate 110, an N+ diffusion region 112 and P+ diffusion regions 113, 114 are formed on a surface of the N well 111 and, further, a gate electrode 115 is formed on the P+ diffusion regions 113, 114 by way of a gate oxide film.

A control voltage terminal 116 is connected to the N+ diffusion region 112 and the P+ diffusion regions 113, 114. The terminal 117 is connected with the oscillation circuit and the gate electrode 115. The P+ diffusion regions 113, 114 form a source electrode and a drain electrode. The N+ diffusion region 112 forms an N-well electrode. In the MOS-type variable capacitance element, by controlling a voltage applied to the control voltage terminal 116, a voltage between the gate electrode 115 and the N well 111 is changed whereby a capacitance value between the gate electrode 115 and the N well 111 is changed.

National Publication of Translated Version of PCT Application 2001-516955 (patent literature 1) proposes a technique similar to the MOS-type variable capacitance element shown FIG. 22.

SUMMARY OF THE INVENTION

However, in the conventional MOS-type variable capacitance element, as shown in FIG. 23, in case a voltage of the control voltage terminal 116 is elevated, a capacitive value C is increased when the voltage exceeds a Vth (a threshold voltage) and hence, a range of the control voltage is limited whereby there arises a drawback that a frequency variable width of a voltage controlled oscillator is narrowed. Further, it is also necessary to restrict a control voltage range to prevent return of frequency.

Accordingly, the present invention has been made to overcome such a drawback and it is an object of the present invention to provide a MOS-type variable capacitance element and a voltage controlled oscillator which can obtain a sufficient capacitance variable change and, at the same time, can eliminate the restriction on a control voltage range.

To overcome the above-mentioned drawbacks, according to the first aspect of the present invention, a MOS-type variable capacitance element includes a MOS transistor in which a second conductive low-concentration diffusion region having polarity opposite to polarity of the first conductive semiconductor substrate is formed on a first conductive semiconductor substrate, a pair of source and drain regions are formed in the inside of the diffusion region, the second conductive high-concentration region is formed in the inside of the diffusion region, a gate oxide film is formed on the diffusion region and a gate electrode is formed on the gate oxide film, a first electrode which connects the source and drain regions to a reference potential, a second electrode which is connected to the gate electrode, and a third electrode which is connected to the high-concentration region and applies a control voltage having polarity equal to polarity of the fist conductive substrate to the high-concentration region using the reference potential as a reference, wherein a variable capacitance element is provided between the second electrode and the third electrode.

According to this invention, assuming that the first conductive type semiconductor substrate is formed of a P-type semiconductor, the potentials of the drain and the source of MOS-type variable capacitance element is set to 0V by connecting the source and drain regions to a ground and hence, when a control voltage is elevated, a phenomenon that a capacitance component is increased when the control voltage exceeds Vth is no more generated and a capacitance component is continuously decreased. Accordingly, it is possible to obtain a sufficient capacitance variable width. Further, it is possible to eliminate the restriction imposed on a control voltage range.

Further, according to the second aspect of the present invention, in the MOS-type variable capacitance element according to the first aspect of the present invention, the gate electrode is divided into a plurality of gate electrodes.

According to this invention, since the gate electrode is divided into the plurality of gate electrodes, compared to a case that one gate electrode is used, it is possible to prevent a voltage drop attributed to the wiring resistance of the gate. Accordingly, it is possible to ensure the sufficient capacitance variable width.

Further, according to the third aspect of the present invention, in a voltage control oscillation circuit having an oscillation circuit and a variable capacitance element, the variable capacitance element is the MOS-type variable capacitance element of the first aspect or the second aspect of the present invention.

According to the third aspect of the present invention, since the MOS-type variable capacitance element which is capable of having the sufficient capacitance variable width is used, the voltage controlled oscillator has a wide frequency band.

BRIEF DESCRIPTION OF THE DRAWINGS

FIG. 1 is a graph showing the constitution of a voltage controlled oscillator according to an embodiment of the present invention;

FIG. 2 is a cross-sectional view of a MOS-type variable capacitance element according to the embodiment;

FIG. 3 is a view showing C-V characteristics of the MOS-type variable capacitance element according to the embodiment;

FIG. 4 is a view for explaining the manner of operation of the MOS-type variable capacitance element according to the embodiment;

FIG. 5 is a view for explaining the manner of operation of the MOS-type variable capacitance element according to the embodiment;

FIG. 6 is a view for explaining the manner of operation of the MOS-type variable capacitance element according to the embodiment;

FIG. 7 is a view for explaining the manner of operation of the MOS-type variable capacitance element according to the embodiment;

FIG. 8 is a view for explaining a change of a depletion layer of an I-MOS-type variable capacitance element;

FIG. 9 is a view for explaining a change of a depletion layer of an I-MOS-type variable capacitance element;

FIG. 10 is a view for explaining the change of the depletion layer of the I-MOS-type variable capacitance element;

FIG. 11 is a view for explaining the change of the depletion layer of the I-MOS-type variable capacitance element;

FIG. 12 is a view for explaining a change of a depletion layer of a conventional A-MOS-type variable capacitance element;

FIG. 13 is a view for explaining the change of the depletion layer of the conventional A-MOS-type variable capacitance element;

FIG. 14 is a view for explaining the change of the depletion layer of the conventional A-MOS-type variable capacitance element;

FIG. 15 is a view for explaining the change of the depletion layer of the conventional A-MOS-type variable capacitance element;

FIG. 16 is a view showing a result of a simulation of an oscillation frequency variable width of the voltage controlled oscillator due to the difference among MOS-type variable capacitance elements;

FIG. 17 is a view showing C-V characteristics of the conventional MOS-type variable capacitance element and the MOS-type variable capacitance element of this embodiment;

FIG. 18 is a plan view of a semiconductor layout of the MOS-type variable capacitance element according to the second embodiment;

FIG. 19 is a cross-sectional view of the MOS-type variable capacitance element shown in FIG. 18 taken along a line A—A;

FIG. 20 is a cross-sectional view of the MOS-type variable capacitance element shown in FIG. 18 taken along a line B—B;

FIG. 21 is a cross-sectional view of the MOS-type variable capacitance element shown in FIG. 18 taken along a line C—C;

FIG. 22 is a cross-sectional view of a conventional MOS-type variable capacitance element; and FIG. 23 is a view showing C-V characteristics of the conventional MOS-type variable capacitance element.

DETAILED DESCRIPTION OF THE INVENTION

Hereinafter, one embodiment to which the present invention is applied is explained in conjunction with drawings. FIG. 1 is a view showing the constitution of a voltage controlled oscillator (VCO) according to this embodiment. In FIG. 1, numeral 1 indicates the voltage controlled oscillator, numeral 2 indicates an inverter amplifier, numeral 3 indicates an output terminal, reference symbol L indicates an inductance, reference symbol C indicates a capacitor, numeral 5A indicates a MOS-type variable capacitance element which is connected to an input terminal of the inverter amplifier 2, numeral 5B indicates a MOS-type variable capacitance element which is connected to an output terminal of the inverter amplifier 2, and numeral 16 indicates a control voltage terminal. Further, the voltage controlled oscillator 1 includes a feedback resistance not shown in the drawing.

Further, in this embodiment, in a state that source and drain electrodes of the MOS-type variable capacitance elements 5A, 5B which are respectively connected with P-type source and drain regions are connected to a ground, the potentials of the drain and the source of the MOS-type variable capacitance elements 5A, 5B are fixed to the 0[V]. In the MOS-type variable capacitance elements 5, by changing a DC voltage applied to the control voltage terminal 16 which is connected to an N well region described, later, the capacitances between the gate electrodes of the MOS-type variable capacitance elements 5 and the N well region are changed thus changing the oscillation frequency of the voltage controlled oscillator 1.

FIG. 2 is a cross-sectional view of the MOS-type variable capacitance element 5 according to this embodiment. As shown in FIG. 2, the MOS-type variable capacitance element 5 is configured such that on a P-type Si substrate 10 which constitutes a first conductive semiconductor substrate, an N well 11 which constitutes a second conductive low-concentration diffusion region having polarity opposite to polarity of the first conductive semiconductor substrate is formed, on a surface of the N well 11, an N+ diffusion region 12 and P+ diffusion regions 13, 14 which constitute a pair of source and drain regions are formed, and a gate electrode 15 is formed on the N well 11 by way of a gate oxide film.

The control voltage terminal 16 is connected to the N+ diffusion region 12. A terminal 17 is connected to an oscillation circuit and the gate electrode 15. A terminal 18 is connected to the P+ diffusion regions 13, 14. The P+ diffusion regions 13, 14 form a source electrode and a drain electrode. The N+ diffusion region 12 forms an N well electrode.

In the MOS-type variable capacitance element 5 according to this embodiment, the terminal 18 which is connected to the P+ diffusion regions 13, 14 is connected to the ground so as to fix the potentials of the drain and source regions to 0V and hence, even when the control voltage exceeds a threshold value Vth of the PMOS transistor, a depletion layer right below the gate electrode 15 continues to spread whereby a capacitance value between the gate electrode 15 and the N well 11 is continuously decreased. Accordingly, it is possible to obtain a sufficient capacitance variable width. Further, it is also possible to eliminate the restriction imposed on a control voltage range.

The C-V characteristics of the MOS-type variable capacitance element 5 according to this embodiment are explained. FIG. 3 is a view which shows the C-V characteristics of the MOS-type variable capacitance element according to this embodiment. Here, FIG. 3 shows the relationship between the control voltage applied to the N well electrode using a semiconductor substrate electrode as the reference and the capacitance C.

As shown in FIG. 3, in the MOS-type variable capacitance element 5 according to this embodiment, a phenomenon that the capacitance C is increased when the control voltage becomes larger than the threshold value Vth which is generated in the C-V characteristics of the conventional MOS-type variable capacitance element shown in FIG. 23 is no more generated. That is, even when the control voltage becomes larger than the threshold value Vth, the capacitance value is continuously decreased as it is. Accordingly, it is possible to ensure the sufficient capacitance variable width. Further, it is also possible to eliminate the restriction imposed on the control voltage range.

Next, the manner of operation of the MOS-type variable capacitance element of this embodiment is explained in conjunction with FIG. 4 to FIG. 15. FIG. 4 to FIG. 7 are views for explaining the manner of operation of the MOS-type variable capacitance element 5 according to this embodiment. As shown in FIG. 4 to FIG. 7, the MOS-type variable capacitance element 5 is configured such that the N well 11 is formed on the P-type Si substrate 10, the N+ diffusion region 12 and the P+ diffusion regions 13, 14 are formed on a surface of the N well 11 and, further, the gate electrode 15 is formed on the P+ diffusion regions 13, 14 by way of a gate oxide film.

The control electrode terminal 16 is connected to the N+ diffusion region 12. The terminal 17 is connected to the gate electrode 15. The terminal 18 is connected to the P+ diffusion regions 13, 14. The P+ diffusion regions 13, 14 form the source electrode and the drain electrode, while the N+ diffusion region 12 forms the N well electrode.

As shown in FIG. 4, in this embodiment, the potential of the control voltage terminal 16 is set to assume the relationship VB1<0 [V]. The potential VG of the terminal 17, which is connected to the gate electrode 15, is set to approximately 0.6 [V]. The potentials of the drain and the source are fixed to 0 [V]. In the state shown in FIG. 4, negative charges are gathered in a portion of the N well 11 below the gate electrode 15 and hence, a depletion layer is not generated.

Next, as shown in FIG. 5, along with the elevation of the potential of the control voltage terminal 16 from VB1 to VB2, positive charges are gradually gathered in the region below the gate electrode 15 and hence, the generation of the depletion layer is started. Next, as shown in FIG. 6, when the potential of the control voltage terminal 16 is elevated from VB2 to VB3, the positive charges are further gathered in the region below the gate electrode 15 and hence, a width of the depletion layer is increased and the capacitance value is gradually decreased.

Next, as shown in FIG. 7, even when the potential of the control voltage terminal 16 is elevated from VB3 to VB4, since the potentials of the drain and source are connected to the ground and hence, assume 0 [V] whereby there is no possibility that the voltage of the control voltage terminal 16 exceeds the threshold value Vth of the transistor and the transistor is held in the OFF state. Accordingly, a phenomenon that the voltage of the control voltage terminal 16 exceeds the threshold value Vth so that the transistor assumes the ON state and a phenomenon that a carrier flows into the region below the gate electrode 15 and reduces the depletion layer can be obviated and the depletion layer continuously spreads.

In this manner, by connecting the terminal 18 which is connected to the P+ diffusion regions 13, 14 to the ground, the potentials of the drain and the source regions are fixed to 0V whereby even when the voltage of the control voltage terminal 16 exceeds the threshold value Vth of the PMOS transistor, the depletion layer below the gate electrode 15 continuously spreads and the capacitance value is continuously reduced.

Next, to clarify the present invention, the change of the depletion layers of the I-MOS-type variable capacitance element (INVERSION-MODE MOS CAPASITOR) and the A-MOS-type variable capacitance element (ACCUMULATION-MODE MOS CAPASITOR) described in P. Andreani and S. Mattisson, "On the Use of MOS Varactors in RF VCO's," IEEE, Journal of Solid-state Circuit Vol. 35 NO. 6 June 2000, pp. 905–915 is explained. Here, these variable capacitance elements are also simply referred to as the I-MOS and the A-MOS.

First of all, the change of the depletion layer of the conventional I-MOS-type variable capacitance element is explained in conjunction with FIG. 8 to FIG. 11. FIG. 8 to FIG. 11 are views for explaining the change of the depletion layer of the conventional I-MOS-type variable capacitance element. As shown in FIG. 8 to FIG. 11, the I-MOS-type variable capacitance element 25 is configured such that the N well 11 is formed on the P-type Si substrate 10, the N+ diffusion region 12 and the P+ diffusion regions 13, 14 are formed on a surface of the N well 11, and the gate electrode 15 is formed on the P+ diffusion regions 13, 14 by way of the gate oxide film.

The control voltage terminal 160 is connected to the P+ diffusion regions 13, 14. The terminal 17 is connected to the oscillation circuit and the gate electrode 15. The terminal 180 is connected to the N+ diffusion region 12. As shown in FIG. 8, in the I-MOS-type variable capacitance element 25, the potentials of the drain and source regions are not fixed to 0[V] and hence, the potential of VS1<0[V] is given.

Further, the potential. VB of the terminal 180 is fixed to the power source voltage VDD, for example, 3.0[V]. Further, the potential VG of the terminal 17 which is connected to the gate electrode 15 is fixed to approximately 0.6[V]. In the state shown in FIG. 8, due to the potential difference between the potential VG of the terminal 17 and the potential VB of the terminal 180, positive charges are gathered in the region below the gate electrode 15 and the depletion layer is generated and hence, the capacitance value assumes a small value.

Next, in FIG. 9, even when the potential of the control voltage terminal 160 is elevated from VS1 to VS2, the potential difference between the potential VG of the terminal 17 and the potential VB of the terminal 180 is not changed and hence, the depletion layer formed in the region below the gate electrode 15 is not particularly changed and the capacitive value is not also specifically changed.

Next, in FIG. 10, even when the potential of the control voltage terminal 160 is elevated from V32 to VS3, the potential difference between the potential VG of the terminal 17 and the potential VB of the terminal 180 is not changed and hence, the depletion layer formed in the region below the gate electrode 15 is not particularly changed whereby the capacitive value is not also specifically changed. Next, in FIG. 11, when the potential of the control voltage terminal 160 is elevated and exceeds VS4 which exceeds threshold voltage (Vth). the transistor assumes the ON state and hence, the carrier flows into the region below the gate electrode 15 whereby the depletion layer is rapidly decreased. Accordingly, the capacitance value is also rapidly elevated. In this manner, as explained in conjunction with the prior art, the C-V characteristics of the MOS-type variable capacitance element 25 assumes (2) shown in FIG. 17 described later.

Next, the change of the depletion layer of the conventional A-MOS-type variable capacitance element is explained in conjunction with FIG. 12 to FIG. 15. FIG. 12 to FIG. 15 are views for explaining the change of the depletion layer of the conventional A-MOS-type variable capacitance element. As shown in FIG. 12 to FIG. 15, the A-MOS-type variable capacitance element 35 is configured such that the N well 11 is formed on the P-type Si substrate 10, the N+ diffusion region 12 and the N+ diffusion regions 33, 34 are formed on a surface of the N well 11, and the gate electrode 15 is formed on the N+ diffusion regions 33, 34 by way of the gate oxide film.

The control voltage terminal 16 is connected to the N+ diffusion region 12 and the N+ diffusion regions 33, 34. The terminal 17 is connected to the oscillation circuit and the gate electrode 15. The terminals 17 are connected to the oscillation circuit and the gate electrode 15. The N+ diffusion regions 33, 34 are formed replacing the drain region and the source region, while the N+ diffusion region 12 constitutes the N well electrode. In a state shown in FIG. 12, the potential of the control voltage terminal 16 is set to have the relationship VB1<0 [V].

Accordingly, the potentials of the N+ diffusion regions 33, 34 are also set to have the relationship VB1<0 [V]. Further, the potential VG of the terminal 17 which is connected to the gate electrode 15 is set to approximately 0.6 [V]. In the state shown in FIG. 12, negative charges are gathered in the region below the gate electrode 15 and hence, the: depletion layer is not generated.

Next, as shown in FIG. 13, along with the elevation of the potential VB of the control voltage terminal 16 from VB1 to VB2, the positive charge is gradually gathered in the region below the gate electrode 15 and the generation of the depletion layer is started. As shown in FIG. 14, when the potential VB of the control voltage terminal 16 is elevated from VB2 to VB3, the positive charges are further gathered in the region below the gate electrode 15 and hence, a width of the depletion layer is increased and the capacitance value is gradually decreased.

As shown in FIG. 15, even when the potential VB of the control voltage terminal 16 is elevated from VB3 to VB4, in the I-MOS, the regions which form the drain region and the source region are N+ and hence, there is no possibility that the inflow of carrier occurs. Accordingly, the depletion layer continues spreading thereof.

Here, the MOS-type variable capacitance element 5 of this embodiment has an advantageous effect that the MOS-type variable capacitance element 5 adopts the usual PROS structure as the structure thereof different from the A-MOS. That is, the A-MOS has no existing analysis parameters such as a SPICE parameter and hence, it is necessary to originally specify these parameters whereby the designing of A-MOS is not easy. To the contrary, the basic constitution of the MOS-type variable capacitance element of this embodiment is the PMOS and hence, the analysis parameters of the PMOS can be directly used and hence, the circuit designing can be facilitated.

Next, a simulation result of the frequency variable width of the variable controlled oscillator due to the difference between the MOS-type variable capacitance element according this embodiment and the conventional MOS-type variable capacitance element shown in FIG. 22 is explained. FIG. 16 is a view showing the simulation result of the oscillation frequency variable width of the voltage controlled oscillator due to the difference between the MOS-type variable capacitance elements. In FIG. 16, the control voltage is taken on an axis of abscissas and the oscillation frequency of the voltage controlled oscillator is taken on an axis of ordinates.

As shown in FIG. 16, according to the MOS-type variable capacitance element of this embodiment, when the potentials of the drain and the source are fixed to 0 [V], along with the elevation of the control voltage, the oscillation frequency is continuously increased and hence, compared with the conventional MOS-type variable capacitance element shown in FIG. 22, it is possible to have an advantageous effect that the variable frequency width of the variable controlled oscillator can be also increased.

Next, the difference between the MOS-type variable capacitance element which is referred to as the I-MOS and the MOS-type variable capacitance element according to this embodiment is explained. FIG. 17 is a view showing the C-V characteristics of the conventional MOS-type variable capacitance element and MOS-type variable capacitance element of this embodiment.

In FIG. 17, (1) indicates the conventional C-V characteristics of the PMOS and (2) indicates the C-V characteristics of the PMOS when the potential of the Sub is fixed to VDD, that is, when the C-V characteristics of the above-mentioned I-MOS is fixed, and (3) indicates the C-V characteristics of the PMOS when the drain and source regions of this embodiment are fixed to 0[V].

The MOS-type variable capacitance element 5 of this embodiment makes use of a portion of the phenomenon that when the potential of the control voltage terminal 16 of the voltage controlled oscillator is elevated, the depletion layer spreads and the capacitance value is gently decreased.

The I-MOS makes use of the change of capacitance which is caused by the phenomenon that the depletion layer is not formed when the potentials of the drain and source regions are elevated and exceed the threshold value Vth. However, when I-MOS makes use of the change of capacitance which is caused by the phenomenon that the depletion layer is not formed when the potentials of the source regions is elevated and exceeds the threshold value Vth, since the change of capacitance is steep, when the voltage controlled oscillator is used as a phase synchronizing circuit, that is, PLL (Phase-Locked Loop), there arises a drawback that the control of Lock of the PLL becomes difficult.

To the contrary, in the MOS-type variable capacitance element 5 of this embodiment, even when the potential is elevated, the depletion layer continuously spreads and exhibits the characteristics that the capacitance value is gradually changed. Further, in the MOS-type variable capacitance element 5 of this embodiment, it is possible to obtain the C-V characteristics shown in FIG. 17 using the conventional PMOS structure.

SECOND EMBODIMENT

Next, a MOS-type variable capacitance element according to the second embodiment is explained. FIG. 18 is a plan view of a semiconductor layout of the MOS-type variable capacitance element according to the second embodiment. FIG. 19 is a cross-sectional view of the MOS-type variable capacitance element shown in FIG. 18 taken along a line A—A. FIG. 20 is a cross-sectional view of the MOS-type variable capacitance element shown in FIG. 18 taken along a line B—B. FIG. 21 is a cross-sectional view of the MOS-type variable capacitance element shown in FIG. 18 taken along a line C—C. In FIG. 18, numeral 41 indicates an aluminum line, numeral 42 indicates a polysilicon (Polysi) layer which turns out to be a gate electrode 15, numeral 43 indicates contacts, and numeral 44 indicates N+ regions 12 on a substrate provided at positions corresponding to the contacts 43 on a periphery. Thereafter, the polysilicon layer 42 is also referred to as a gate electrode layer 42.

As shown in FIG. 18, the gate electrode layer 42 is arranged such that the gate electrode layer 42 is sandwiched between the contacts of a pair of source and drain regions. Four gate electrode layers 42 are arranged in the left and right directions. Four gate electrode layers 42 of four transistors are connected in common with the aluminum line 41. Accordingly, in the MOS-type variable capacitance element 60 shown in FIG. 18, 16 transistors are formed and 16 gate electrode layers 42 which are arranged in a separated manner are provided. Further, the gate electrode layers 42 form a common gate electrode through the left-side aluminum line 41. That is, in the MOS-type variable capacitance element 60, 16 transistors are connected in parallel using the gate electrode.

Further, the contacts which surround the periphery are contacts for N well electrodes. Further, contacts which are arranged in two rows in the left-and-right direction between the first row and the second row of the gate electrode layers 42 from below and contacts which are arranged in two rows in the left-and-right direction between the third row and the fourth row of the gate electrode layers 42 from below are also contacts for N well electrodes. In the drawing, these N well electrode contacts are indicated as SubN+ regions. As shown in FIG. 18, the gate electrode layers 42 are separated into a plurality of electrode layers and are connected to each other by the aluminum line 41 and hence, compared to a case that a single straight gate electrode layer is used, the voltage drop attributed to the wiring resistance of the gate can be prevented more effectively. As shown in FIG. 19 to FIG. 21, in the MOS-type variable capacitance element 60 according to the second embodiment, the N well 51 is formed on the P-type Si substrate 50. On a surface of the N well 51, the N+ diffusion region 52 and the P+ diffusion region 53 are formed. As shown in FIG. 20, numeral 42 indicates the polysilicon regions which constitute gate electrode layers, numeral 54 indicates an element separation region provided between the P+ diffusion region 52 and the N+ diffusion region 53.

According to this embodiment, as shown in FIG. 18, different from the case in which the MOS-type variable capacitance element uses only one gate electrode layer 42, the semiconductor layout is made to finely divide the gate electrode layer 42 and hence, the voltage drop or the like attributed to the wiring resistance of the gate can be prevented whereby the MOS-type variable capacitance element can obtain the sufficient capacitance variable width. Accordingly, it is possible to ensure the sufficient oscillation frequency variable width.

Although the preferred embodiments of the present invention have been explained heretofore, the present invention is not limited to the specific embodiments and various modifications and changes can be made within the gist of the present invention described in the claims. For example, in the above-mentioned respective embodiments, the MOS-type variable capacitance element is constituted by using the P type as the first conductive type and the N type as the second conductive type, it may be possible to constitute the MOS-type variable capacitance element by exchanging these P type and N type thus exchanging polarities of control voltage with respect to the reference potential. In this case, the reference potential may be set to the power source potential VDD and the control voltage may be controlled in the direction to be lowered from the power source potential VDD.

As has been explained heretofore, according to the present invention, it is possible to provide the MOS-type variable capacitance element and the voltage controlled oscillator which can acquire the sufficient capacitance valuable width.

What is claimed is:

1. A MOS-type variable capacitance element comprising:
a semiconductor substrate of a first dopant type;
low-concentration diffusion region of a second donant type opposite to polarity of the semiconductor substrate formed in the semiconductor substrate;
a source region of the first dopant type and formed in said low-concentration diffusion region;
a drain region of the first dopant type formed in said low-concentration diffusion region;
a high-concentration diffusion region of the second dopant type formed in the low-concentration diffusion region;
a gate oxide film formed on the low-concentration diffusion region;
a gate electrode is formed on the gate oxide film;
a reference potential source;
a first electrode which connects the source and drain regions to the reference potential source;
a capacitance controlled circuit having a capacitance controlled input;
a second electrode which is connected to the gate electrode and does not form an electrode connection to said first electrode, the second electrode being connected to the capacitance controlled input;
a control voltage input accepting a control voltage which is variable; and
a third electrode connected to the high-concentration diffusion region and the control voltage input for accepting the control voltage in a range having polarity equal to polarity of the first dopant type of the semiconductor substrate to the high-concentration diffusion region using the reference potential as a reference, wherein
a variable capacitance element is provided between the second electrode and the third electrode.

2. The MOS-type variable capacitance element according to claim 1, wherein the gate electrode is divided into a plurality of gate electrodes.

3. The MOS-type variable capacitance element according to claim 1, wherein the first dopant type is p-type and the second dopant type is n-type.

4. The MOS-type variable capacitance element according to claim 3, wherein the source region and the drain region have a high concentration of the first dopant type relative to the semiconductor substrate.

5. The MOS-type variable capacitance element according to claim 1, wherein the source region and the drain region have a high concentration of the first dopant type relative to the semiconductor substrate.

6. A voltage controlled oscillator circuit comprising:
a capacitance controlled oscillator circuit having a capacitance controlled input; and
a MOS-type variable capacitance element comprising:
a semiconductor substrate of a first dopant type;
a low-concentration diffusion region of a second dopant type opposite to polarity of the semiconductor substrate formed in the semiconductor substrate;
a source region of the first dopant type and formed in said low-concentration diffusion region;
a drain region of the first dopant type formed in said low-concentration diffusion region;
a high-concentration diffusion region of the second dopant type formed in the low-concentration diffusion region;
a gate oxide film formed on the low-concentration diffusion region;
a gate electrode formed on the gate oxide film;
a reference potential source;
a first electrode connecting the source and drain regions to the reference potential source
a second electrode connected to the gate electrode and not forming an electrode connection to said first electrode, the second electrode being connected to the capacitance controlled input;
a control voltage input; and
a third electrode connected to the high-concentration diffusion region and the control voltage input, wherein the MOS-type variable capacitance element provides a variable capacitance between the second electrode and the third electrode which is controlled by a voltage applied to the control voltage input.

7. The voltage controlled oscillator circuit according to claim 6 further comprising a control voltage source outputting a variable control voltage to the control voltage input, the variable control voltage having polarity equal to polarity of the first dopant type.

8. The voltage controlled oscillator circuit according to claim 7, wherein the first dopant type is p-type and the second dopant type is n-type.

9. The voltage controlled oscillator circuit according to claim 8, wherein the source region and the drain region have a high concentration of the first dopant type relative to the semiconductor substrate.

10. The voltage controlled oscillator circuit according to claim 7, wherein the source region and the drain region have a high concentration of the first dopant type relative to the semiconductor substrate.

11. The voltage controlled oscillator circuit according to claim 6, wherein the first dopant type is p-type and the second dopant type is n-type.

12. The voltage controlled oscillator circuit according to claim 11, wherein the source region and the drain region have a high concentration of the first dopant type relative to the semiconductor substrate.

13. The voltage controlled oscillator circuit according to claim 6, wherein the source region and the drain region have a high concentration of the first dopant type relative to the semiconductor substrate.

* * * * *